US005173617A

United States Patent [19]
Alsup et al.

[11] Patent Number: 5,173,617
[45] Date of Patent: Dec. 22, 1992

[54] DIGITAL PHASE LOCK CLOCK GENERATOR WITHOUT LOCAL OSCILLATOR

[75] Inventors: Mitchell Alsup, Dripping Springs; Carl S. Dobbs, Austin, both of Tex.; Yung Wu; Claude Moughanni; Elie I. Haddad, both of Austin, Tex.

[73] Assignee: Motorola, Inc., Schaumburg, Ill.

[21] Appl. No.: 391,689

[22] Filed: Aug. 10, 1989

Related U.S. Application Data

[63] Continuation-in-part of Ser. No. 212,396, Jun. 27, 1988, abandoned.

[51] Int. Cl.$^5$ .......................... H03K 5/13; H03K 5/22
[52] U.S. Cl. ................................. 307/269; 307/262; 328/155; 328/63; 328/72; 375/119
[58] Field of Search ............... 328/55, 155, 63, 72; 307/514, 262, 269; 375/81, 118–120; 377/34, 43, 49, 57

[56] References Cited

U.S. PATENT DOCUMENTS

| | | | |
|---|---|---|---|
| 3,436,647 | 4/1969 | Gobeli et al. | 328/155 |
| 3,883,810 | 5/1975 | Tacussel | 307/606 |
| 4,016,511 | 4/1977 | Ramsey et al. | 377/76 |
| 4,309,649 | 1/1982 | Naito | 328/155 |
| 4,475,088 | 10/1984 | Beard | 328/134 |
| 4,494,021 | 1/1985 | Bell et al. | 307/591 |
| 4,495,468 | 1/1985 | Richards et al. | 328/134 |
| 4,577,163 | 3/1986 | Culp | 328/155 |
| 4,742,254 | 5/1988 | Tomisawa | 307/606 |
| 4,795,985 | 1/1989 | Gailbreath, Jr. | 328/155 |
| 4,894,626 | 1/1990 | Kubinec | 307/603 |
| 4,922,141 | 5/1990 | Lofgren et al. | 328/155 |

OTHER PUBLICATIONS

Design of PLL-Based Clock Generation Circuits, Apr. 1, 1987, Jeong, et al. 1987 IEEE, pp. 255-261.

*Primary Examiner*—Timothy P. Callahan
*Attorney, Agent, or Firm*—Charlotte B. Whitaker

[57] ABSTRACT

A digital phase lock loop that does not depend on a voltage controlled oscillator (VCO) for phase locking. A phase detector (PD), terminated with a latch, controls an up/down counter that programs an increase/decrease of delay on the delay line. The tapped output of the delay line goes through a two phase generator which in turn feeds back to the PD for comparison with the reference clock. This process is repeated until phase locking is obtained.

16 Claims, 8 Drawing Sheets

DIGITAL PHASE LOCK CLOCK GENERATOR WITHOUT LOCAL OSCILLATOR

This application is a continuation-in-part of prior U.S. application Ser. No. 07/212,396, filed Jun. 27, 1989, now abandoned.

FIELD OF THE INVENTION

The invention relates generally to clock generation circuits, and more specifically to a clock generation circuit using a digital phase locked loop.

BACKGROUND OF THE INVENTION

Phase-locked loops (PLLs) are commonly used in digital data processing systems, particularly single-chip microprocessors, for the generation of internal (on-chip) clock signals from an external (off-chip) reference clock. In general, PLL-based clock generators are designed using voltage controlled oscillators (VCO). For example, in U.S. Pat. No. 4,494,021, the VCO is comprised of a recirculating delay line, wherein the delay per stage is varied in proportion to the relationship between the frequencies of the control and controlled signals. In "Design of PLL-Based Clock Generation Circuits", *IEEE Journal of Solid-State Circuits*, Vol. SC-22, No. 2, Pages 255-261, April 1987, a similar ring oscillator VCO, provided with taps between successive delay stages, is used to generate nonoverlapping clock phases of a system clock. However, since such VCO's are essentially analog in nature, integration with digital circuitry requires a significantly more complex and expensive manufacturing process. It would be of significant benefit if a PLL could be constructed entirely of digital components.

SUMMARY OF THE INVENTION

Accordingly, a primary object of the present invention is to provide a digital phase-locked clock generator that does not depend on a voltage controlled oscillator (VCO) for phase locking or clock generation.

Another object of the present invention is to provide an all digital, phase locked clock generator circuit.

Yet another object of the present invention is to provide a general purpose, all digital, phase locked loop.

These and other objects are achieved in a digital phase-locked clock generator for providing an internal clock signal, the edges of which are phase-locked to the predetermined edges of an external reference signal. In the preferred form, the digital phase-locked clock generator comprises: phase detection means for comparing a first edge of a digital waveform of the external reference signal with a second edge of a digital waveform of the internal clock signal, and providing a digital control signal which indicates the direction of the error therebetween; first means coupled to said detection means for latching the digital control signal, and for activating an increase or decrease of a delay line in response to said digital control signal; n stage delay means coupled to the first means for selecting a tap delay line which corresponds to a fixed amount of delay per stage, and for providing an output digital waveform delayed by a selected amount; second means for multiplexing said output digital waveform with a set of selected digital waveforms, and for providing one of the selected digital waveforms to a two phase clock generator; third means coupled to second means for generating nonoverlapping internal clock phases from the selected digital waveform, and for providing one of said nonoverlapping internal clock phases to said phase detection means for comparison with the digital waveform of the external reference signal.

DETAILED DESCRIPTION OF THE INVENTION

Figure 1:
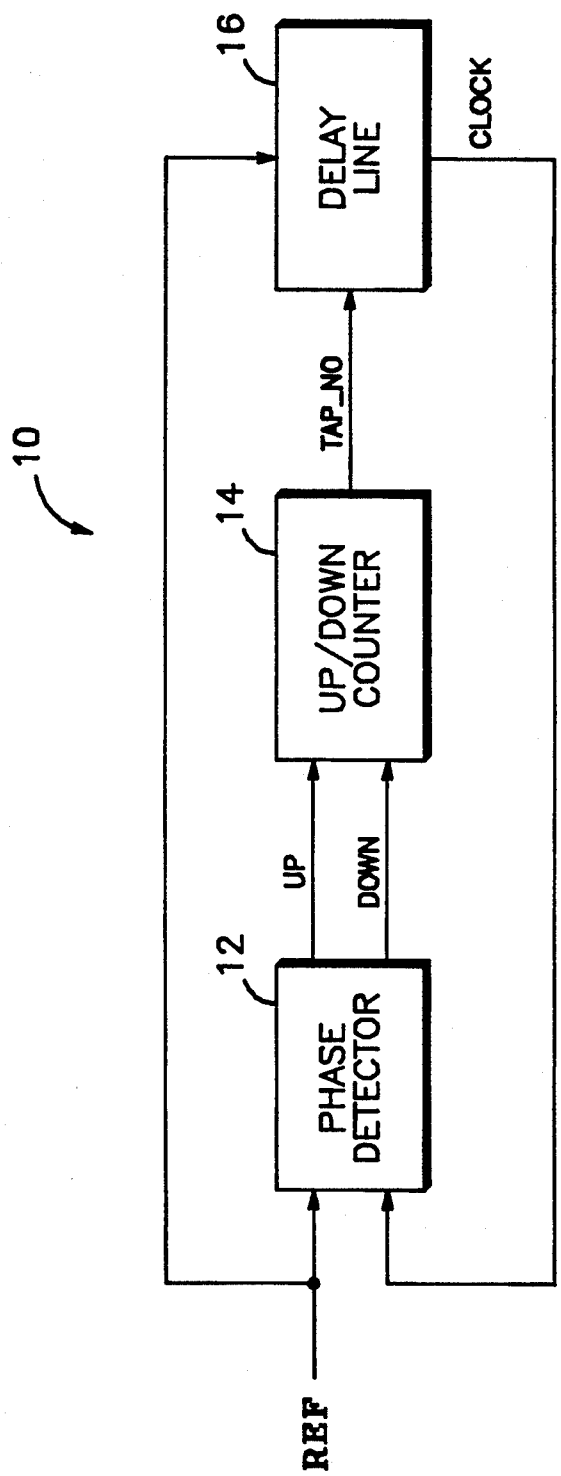
FIG. 1 is a general block diagram of an all digital, phase-locked clock generator constructed in accordance with the present invention.

Shown in FIG. 1 is an all digital, phase-locked clock generator 10 which generates a clock signal; CLOCK, phase locked to an external reference (REF) clock. In the preferred form, the clock generator 10 comprises a phase detector (PD) 12, an up/down counter 14, and a multi-stage delay line 16. The phase detector 12 compares a selected edge, rising or falling, of the external REF signal with the corresponding selected edge of the CLOCK, and provides either an UP or DOWN signal, depending upon whether the CLOCK is early or late with respect to the REF clock. In response to the UP/DOWN signals, the up/down counter 14 will increment or decrement, respectively, a tap number (TAP_NO), and provide a corresponding TAP_NO signal to the delay line 16. A shift register (not shown) may be used, instead of the up/down counter 14 for selection of the corresponding tap on the delay line 16. In response to the TAP_NO; the delay line 16 will provide the delayed form of the REF clock present at the corresponding tap number of the delay line 16. In effect, each UP or DOWN signal provided by the phase detector 12 increases or decreases, respectively, the length of the delay line 16, and "moves" the edge of the CLOCK by the time delay of one delay stage.

In the preferred embodiment of the clock generator 10 (shown in FIG. 2), the phase detector 12 provides UU or DD signal pulses, depending upon the phase difference between the REF clock and a $\Phi_1$ clock. The phase detector (PD) 12 also provides a COUNT signal which is essentially the logical OR of the UU and DD signals. In response to the COUNT signal, an up/down signal generator 20 provides complementary count-up (CNT_UP) and count-down (CNT_DN) signals. Simultaneously; a counter clock generator 18 "stretches" both the UU and the DD pulses to provide a counter clock (CNT_CLK) signal. In response to receiving the CNT_CLK signals, the up/down counter 14 will count in the direction indicated by the CNT_UP/CNT_DN signals.

In the preferred form, the delay line 16 is comprised of sixty-four (64) stages of delay, arranged in an eight (8) row by eight (8) column matrix, with each stage being a uniquely addressable tap. To "address" the proper tap in the matrix, the up/down counter 14 provides the tap number (TAP_NO) as a six (6) bit binary number, with the lower three (3) bits (G0:G2), shown in FIG. 6, comprising a row address (ROW) and the upper three (3) bits (G3:G5), shown in FIG. 6, comprising a column address (COL). The up/down counter 14 is a grey code counter. Consecutive binary numbers often differ in more than one bit. Accordingly, more than one bit may toggle between one number and another, thereby leading to an occasional race between the row and column selection of the decoding circuitry. For example, in the case where a binary up/down counter (not shown) value changes from count of 7 to a count of 8, the decoding of the associated binary address would be as follows:

|  | Col/Row | | Col/Row |
|---|---|---|---|
| Binary | Tap 7 (000/111) | → | Tap 8 (001/000) |
| Decimal | Tap 7 (0/7) | → | Tap 8 (1/0) |

Ideally, the reference (REF) clock signal should have its delay increased from 7 to 8 stages, however, in the above scheme, a race condition may occur. The occurrence of the race condition, may cause the decoding of the binary address to occur as follows:

|  | Col/Row | | Col/Row | | Col/Row |
|---|---|---|---|---|---|
| Binary | Tap 7 (000/111) | → | Tap 15 (001/111) | → | Tap 8 (001/000) |
| Decimal | Tap 7 (0/7) | → | Tap 15 (1/7) | → | Tap 8 (1/0) |

Figure 7A:
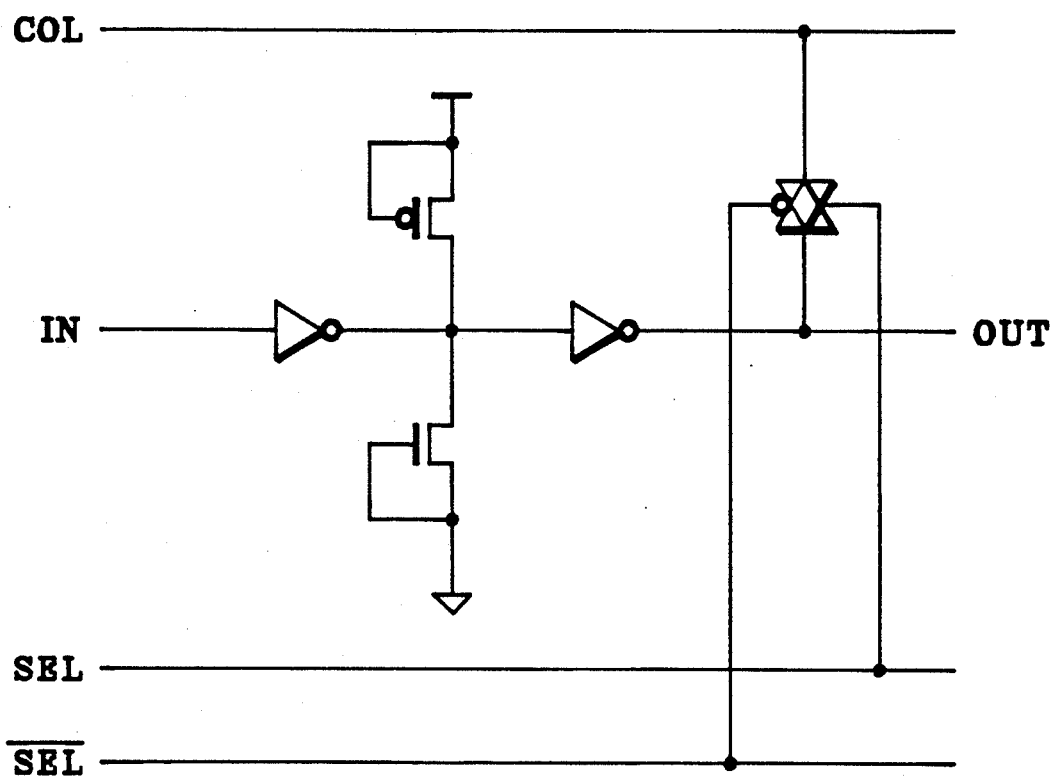
FIG. 7A illustrates the preferred form of each of the delay stages of the delay line of FIG. 2.
Figure 7B:
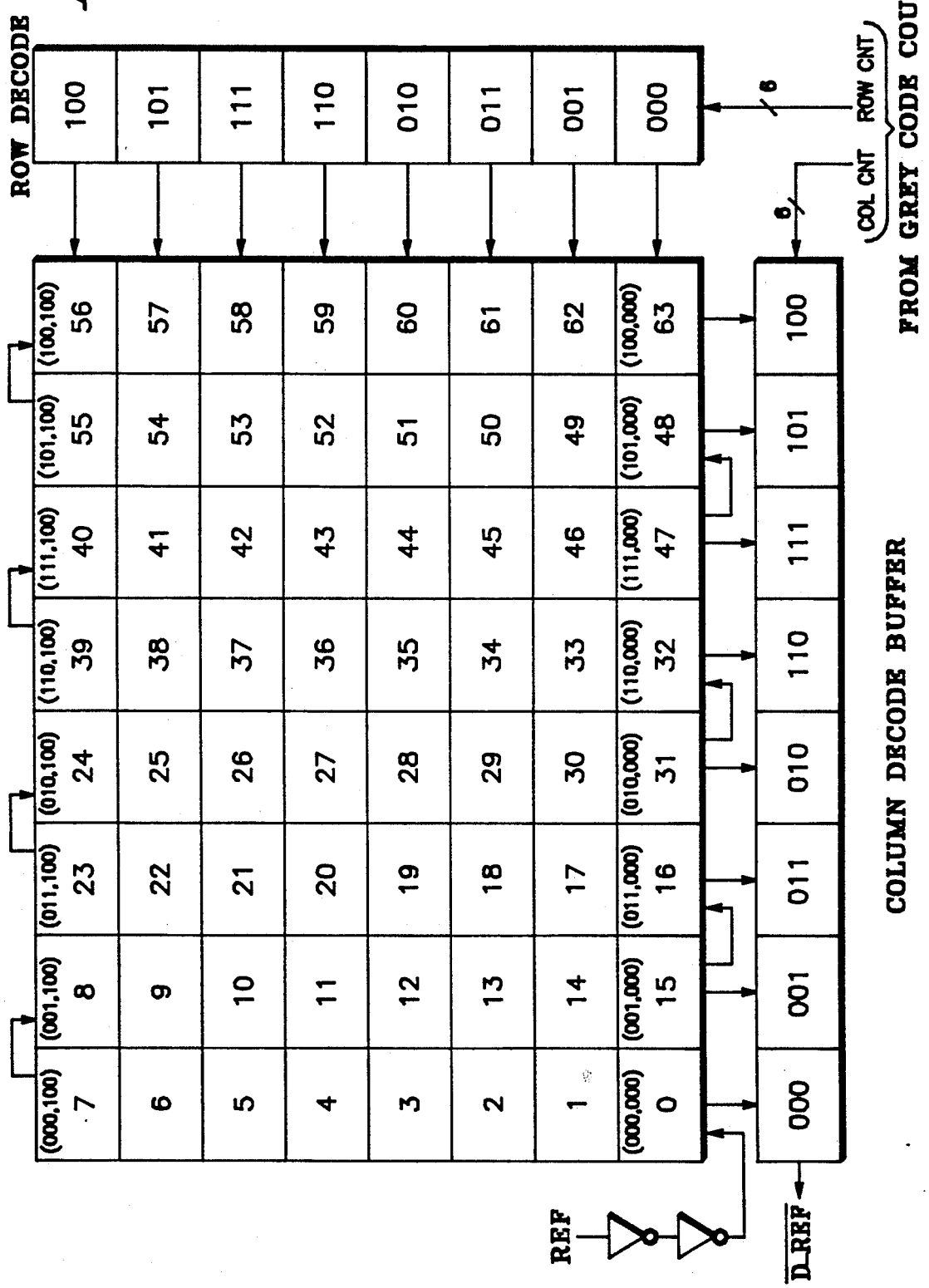
FIG. 7B illustrates the preferred, 8×8 matrix form of the 64-stage delay line of FIG. 2.

The erroneous transition from Tap 7 to Tap 15 may cause a momentary glitch in the clock REF signal propagating through the delay line 16, or alternatively, the pulse width of the delayed clock signal (D_REF) may be inadvertently shortened or lengthened. A pulse width change in the delayed D_REF signal coming out of delay line 16 translates to an equal change in the $\Phi_1$ and $\Phi_2$ clock signals (discussed below). Whereas, a glitch in the clock REF signal may cause an extra or missing clock edge in the delayed D_REF signal. Consequently, the occurrence of either of these erroneous phenomenon will adversely effect the operation of internal circuitry, since The design of the grey code up/down counter 14 insures that only one bit of the tap address changes when counting up or down. This design feature eliminates any potential race condition caused by the row and column decoding circuitry, by guaranteeing that only one bit in the tap address changes when sequentially selecting the next tap stage. The use of the grey code counter 14 with the serpentine configuration of the delay line 16 reduces the number of select lines required to change from one tap address to another. Shown in FIG. 7B is a block diagram illustrating the configuration of the serpentine delay line 16. The Row select logic 22, of conventional form, receives the ROW number and enables the eight (8) taps comprising the corresponding row to simultaneously provide the respective, delayed forms of the REF signal. Simultaneously, column select logic 24, also of conventional form, receives the COL number and enables the single tap in the corresponding column to provide the respective, delayed form of the REF signal as a D_REF signal. A LOCK_EN signal may disable the phase lock circuitry of the clock generator 10 while coupling the REF signal directly to the 2-phase generator 28. A mux 26 selectively couples either the REF signal or the D_REF signal to a 2-phase generator 28, depending upon the state of the LOCK_EN signal. In response, the generator 28 provides two (2) nonoverlapping clock signals, $\Phi_1$ and $\Phi_2$, from whichever signal, REF or D_REF, is provided by the mux 26. Preferably, the LOCK_EN signal also selectively enables/disables the other circuitry of the clock generator 10 when the REF signal is being used to drive the generator 28.

Figure 2:
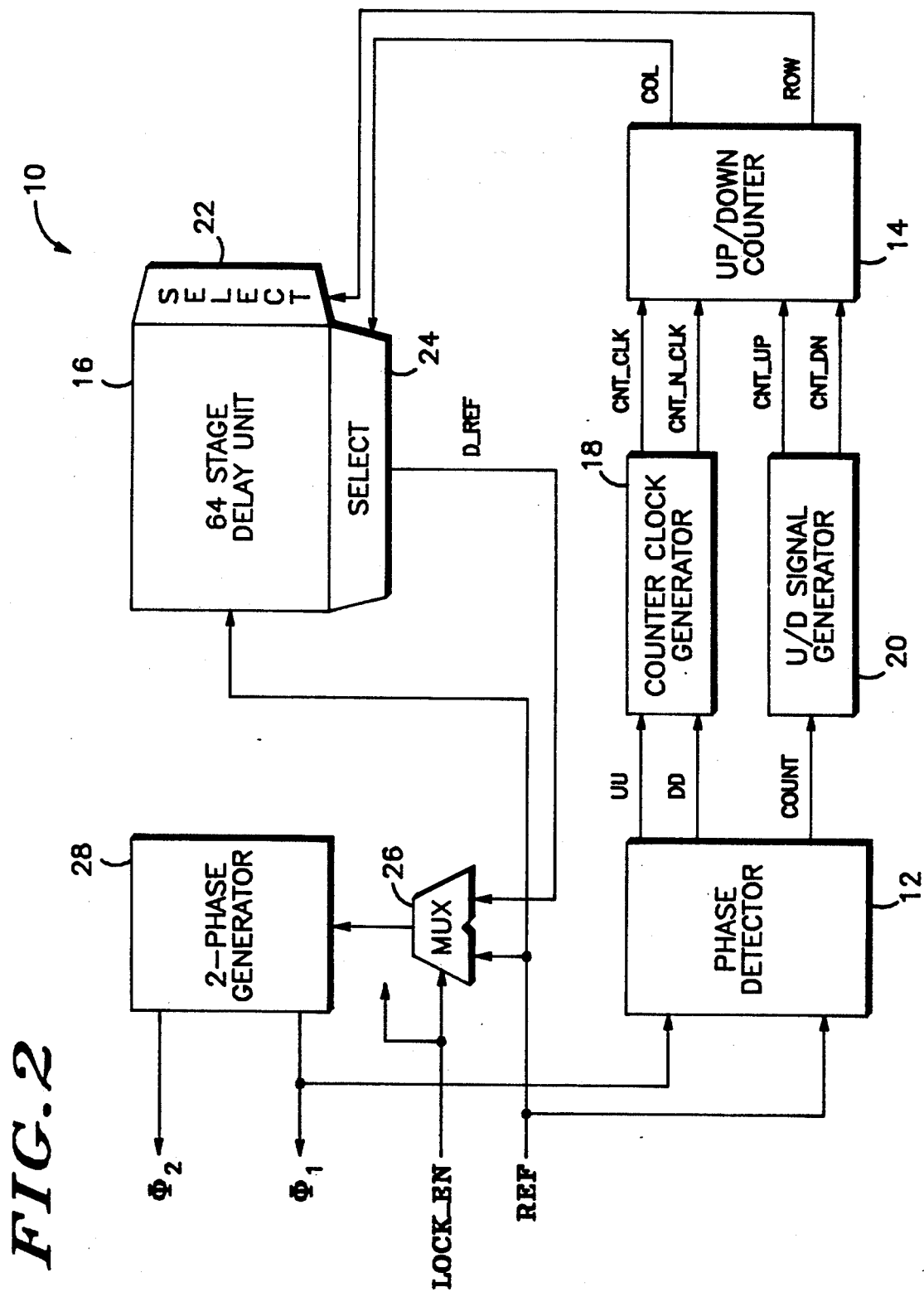
FIG. 2 is a detailed block diagram of the clock generator of FIG. 1.
Figure 3:
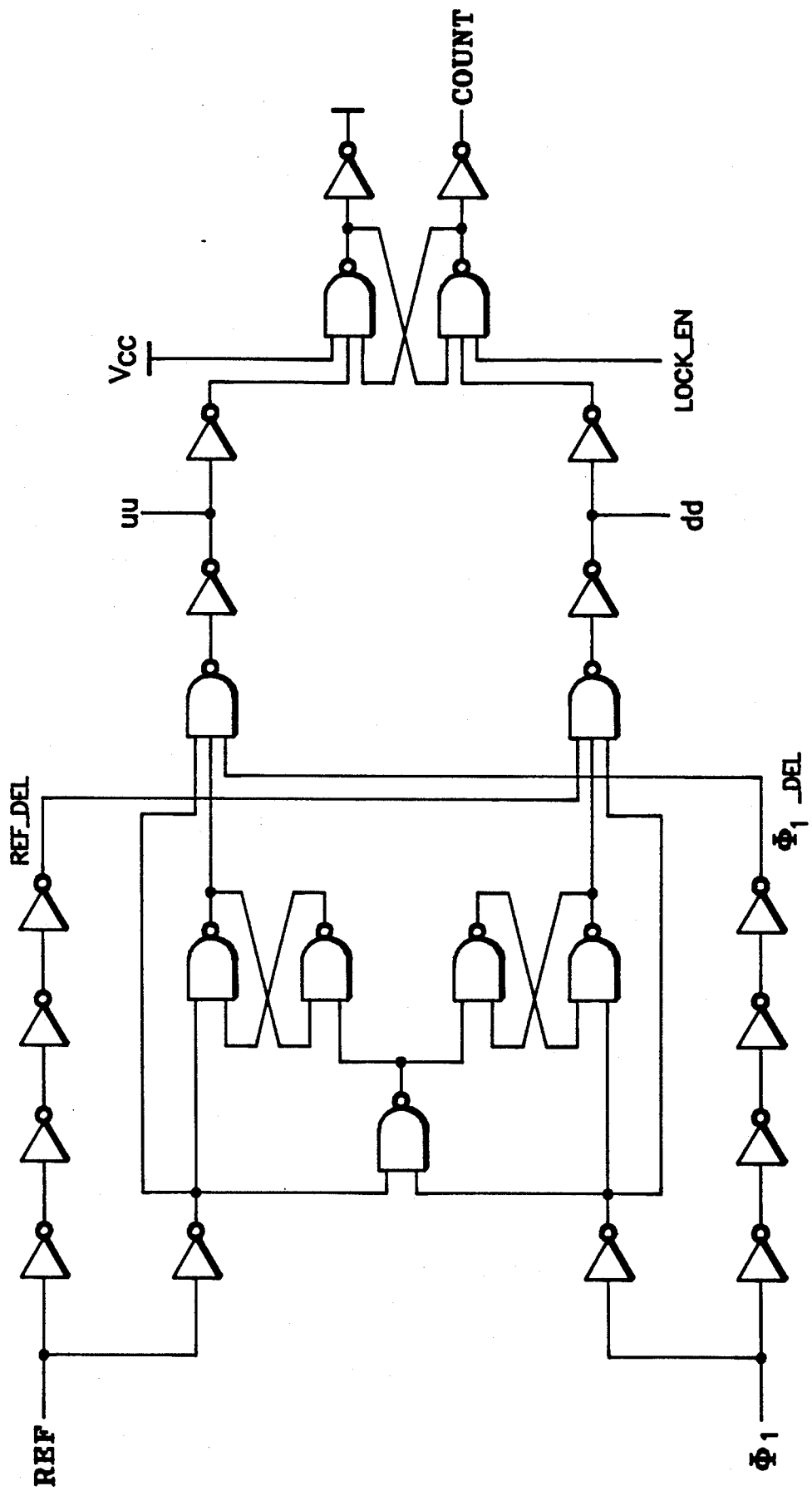
FIG. 3 illustrates the preferred embodiment of the phase detector of FIG. 2.
Figure 4:
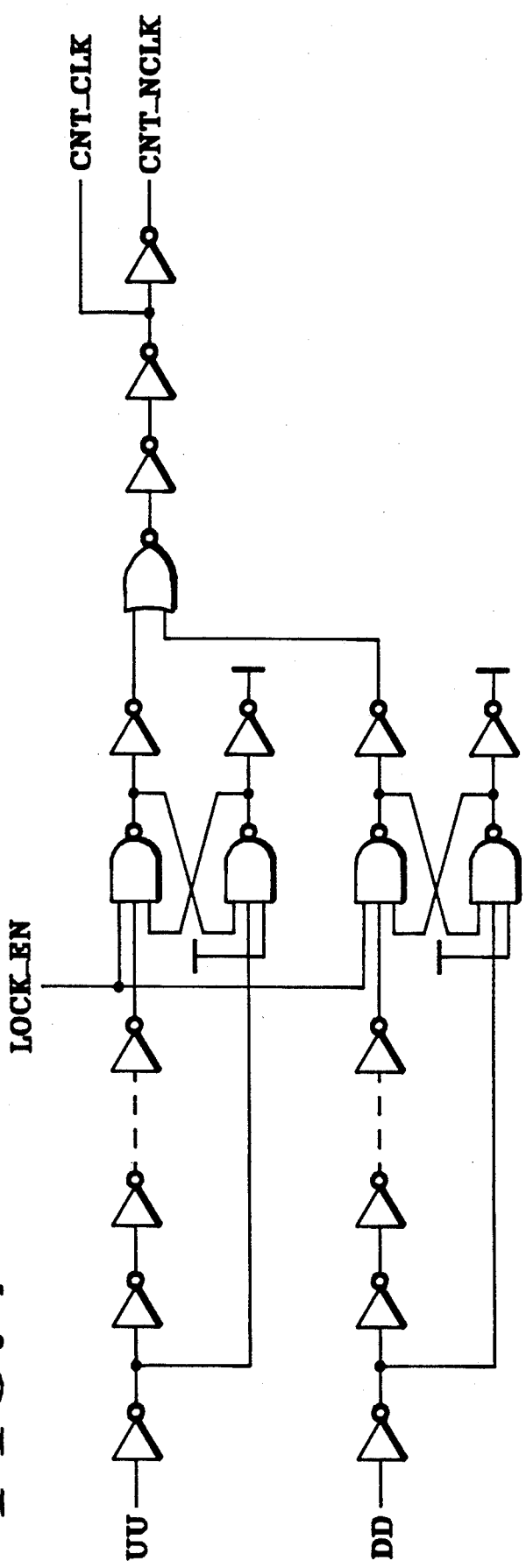
FIG. 4 illustrates the preferred embodiment of the counter clock generator of FIG. 2.
Figure 5:
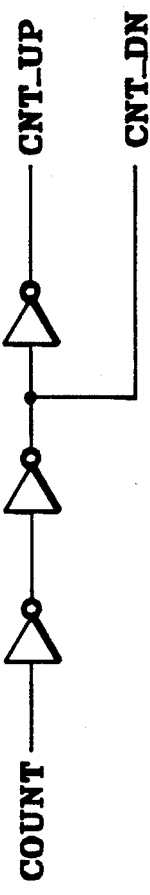
FIG. 5 illustrates the preferred embodiment of the up/down signal generator of FIG. 2.
Figure 6:
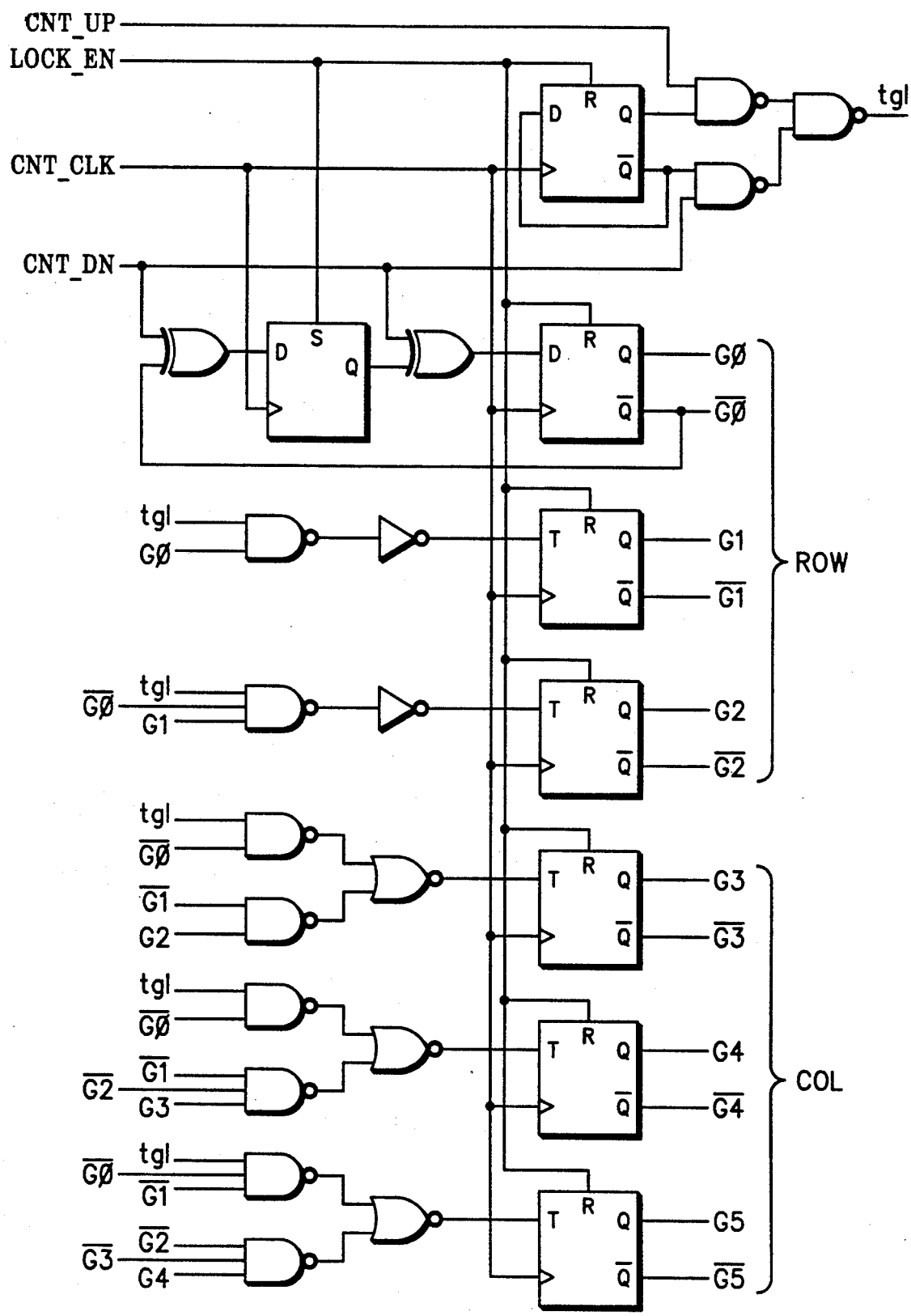
FIG. 6 illustrates the preferred embodiment of the up/down counter of FIG. 2.
Figure 8:
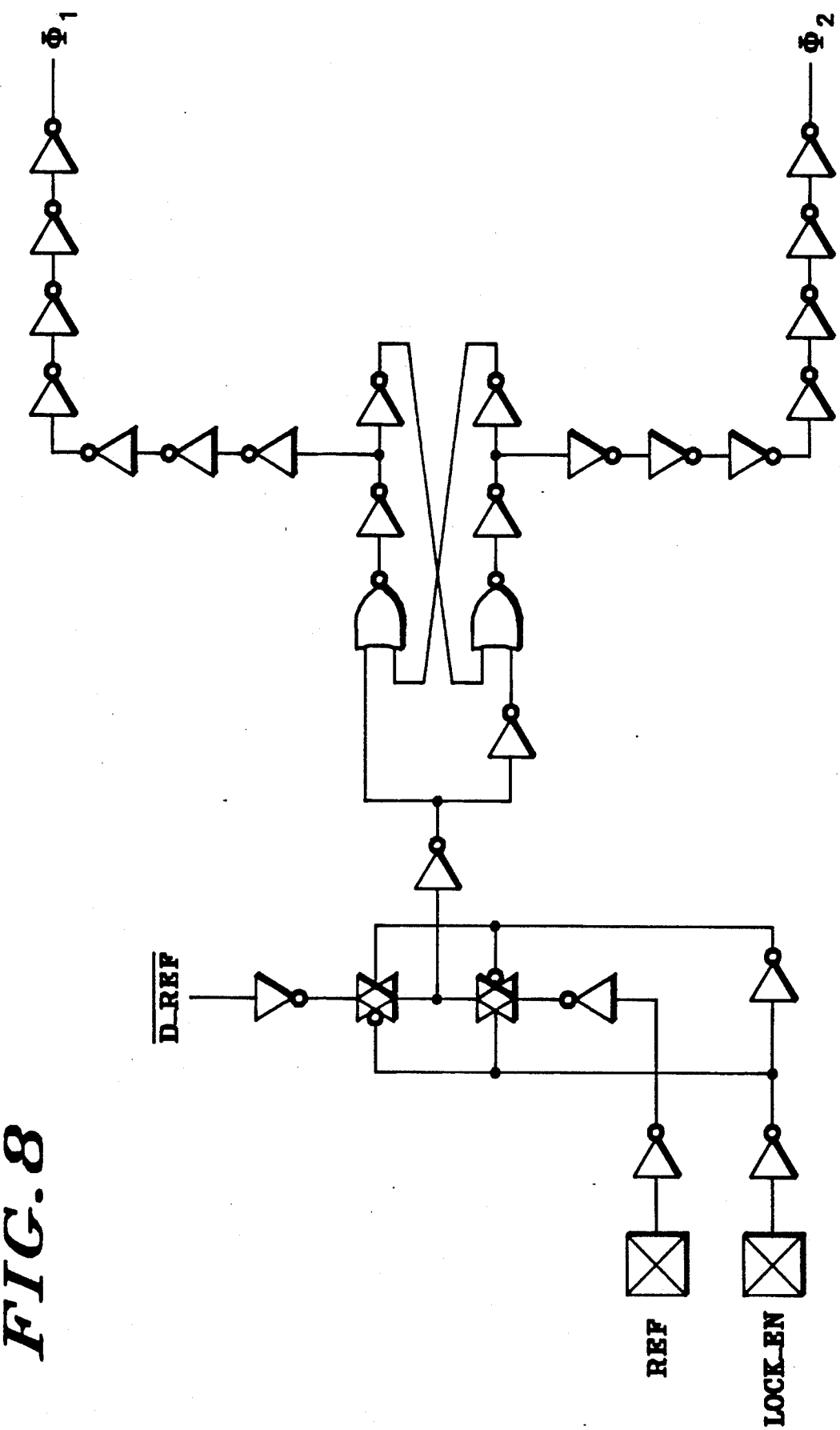
FIG. 8 illustrates the preferred form of the two-phase generator of FIG. 2.

Shown in FIG. 3 is a preferred embodiment of the phase detector 12 of FIG. 2. Shown in FIG. 4 is a preferred form of the counter clock generator 18. FIG. 5 illustrates the preferred form of the up/down signals generator 20. Illustrated in FIG. 6 is a preferred embodiment of the up/down counter 14. The preferred form of the delay stages comprising delay line 16 is shown in FIG. 7A, while FIG. 7B illustrates the preferred matrix arrangement of the sixty-four (64) delay stages of the delay line 16. FIG. 8 illustrates the preferred embodiment of the 2-phase generator 28 of FIG. 2.

In the preferred form, the PD 12 can be tuned so that the smallest phase error which can be detected is one-half ($\frac{1}{2}$) of the stage delay of the delay line. This ensures that the tap which provides the minimum phase error is detected. Furthermore, the inverter delay between the $\Phi_1$-phase/frequency path, and the REF phase/frequency path is designed to ensure that the corresponding delay signals $\Phi_1\_DEL$ and REF_DEL arrive at the output latch simultaneously, thereby eliminating clock skew if both paths have identical layout and orientation.

While the invention has been described in a preferred embodiment, it will be apparent to those skilled in the art that the disclosed invention may be modified in numerous ways and may assume many embodiments other than that specifically set out and described above. For example, the delay line 16 may be implemented as a linearized multi-dimensional array (as opposed to a two-dimensional array), and sequentially accessed by a grey code address. Furthermore, the use of a grey code address to sequentially access a linearized multi-dimensional array may be utilized in memories with burst mode accesses. Accordingly, it is intended by the appended claims to cover all modifications of the invention which fall within the true spirit and scope of the invention.

We claim:

1. An all digital phase-locked clock generator for providing a digitally generated clock signal at least one edge of which is phase-locked to a selected edge of a reference signal, the clock generator comprising:

a variable length, digital delay line means for receiving the reference signal and a delay line length signal, delaying the reference signal in proportion to said delay line length signal, and providing the delayed reference signal as said digitally generated clock signal;

digital phase detection means for receiving the reference signal and the digitally generated clock signal, detecting the phase difference between the selected edge of the reference signal and said one edge of the digitally generated clock signal, and providing a digital phase error signal proportional to the detected phase difference therebetween; and digital delay line length control means, coupled to the phase detection means and to the variable length delay line means, for receiving the digital phase error signal, and providing said delay line length signal comprising a multi-bit address, said digital delay line length control means selectively varying said delay line length signal, in response to the digital phase error signal, by increasing or decreasing a portion of said multi-bit address, to minimize the phase difference between the selected edge of the reference signal and said selected edge of the digitally generated clock signal.

2. The generator of claim 1 wherein said multi-bit address comprises a row select portion and a column select portion, and wherein said delay line means comprises:

a delay line having m*n delay stages arranged in m rows of n delay stages, where m and n are each integers greater than 1, each of said delay stages having an input for selectively receiving the reference signal, and a tap provided at an output of each delay stage for selectively providing the delayed reference signal as said digitally generated clock signal;

row selector means, coupled to said delay line, for receiving said row select portion of said multi-bit address comprising said delay line length signal, said row selector means enabling each of the n taps of the row of said delay line selected by said row select portion of said multi-bit address comprising said delay line length signal; and column selector means, coupled to said delay line, for receiving said column select portion of said multi-bit address comprising said delay line length signal, said column selector means using said column select portion to enable a single one of said enabled n taps of said selected row of said delay line selected by said row select portion, to provide said clock signal.

3. The generator of claim 2 wherein said phase detector means provides said phase error signal having a first value if the selected edge of said reference signal is detected before said one edge of said digitally generated clock signal, and a second value if the selected edge of said reference signal is detected after said one edge of said digitally generated clock signal.

4. The generator of claim 3 wherein the digital delay line length control means selectively decreases the row or column select portion of said multi-bit address comprising said delay line length signal in response to said digital phase error signal having said first value, and selectively increases the row or column select portion of said multi-bit address comprising said delay line length signal in response to said digital phase error having said second value.

5. The generator of claim 4 wherein the digital delay line length control means comprises an up/down counter.

6. The generator of claim 5 wherein said up/down counter is a grey code counter.

7. The generator of claim 1 wherein said digital phase detector means provides said digital phase error signal having said first value if the selected edge of said reference signal is detected before said one edge of said digitally generated clock signal, and said second value if the selected edge of said reference signal is detected after said one edge of said digitally generated clock signal.

8. The generator of claim 7 wherein the digital delay line length control means selectively decreases the row select portion or the column select portion of said multi-bit address comprising said delay line length signal in response to said digital phase error signal having said first value, and selectively increases the row select portion of the column select portion of said multi-bit address comprising said delay line length signal in response to said digital phase error signal having said second value.

9. The generator of claim 8 wherein the digital delay line length control means comprises an up/down counter.

10. The generator of claim 9 wherein said up/down counter is a grey code counter having input means for receiving said digital phase error signal and a control signal, and output means for providing said delay line length control signal, in response thereto.

11. The generator of claim 1 further comprising:
a multiplexor coupled to said digital delay line means for receiving the digitally generated clock signal, and for receiving said reference signal, and for selectively providing a selected one of said reference signal and said digitally generated clock signal.

12. The generator of claim 11 further comprising:
phase generator means coupled to said multiplexor, for receiving said selected signal from said multiplexor and generating first and second nonoverlapping internal clock phases from said selected signal, and for providing as said digitally generated clock signal a selected one of said first and second clock phases to said phase detection means for comparison with said reference signal.

13. An integrated circuit having a grey code linearized multidimensional array, which is sequentially accessed, said integrated circuit comprising:

a plurality of addressable cells organized in an x dimensional array, where x is an integer greater than or equal to 2, said plurality of addressable cells being sequentially accessed by a grey code address;

first decoder means, coupled to a first dimension of said n dimensional array, for selecting a first subset of said plurality of addressable cells, in response to a first portion of said grey code address;

second decoder means, coupled to a second dimension of said x dimensional array, for selecting a second subset of said plurality of addressable cells, in response to a second portion of said grey code address, whereby said second subset of said plurality of addressable cells intersects with said first subset of said plurality of addressable cells thereby accessing a first addressable cell in a sequence of said plurality of addressable cells; and buffer means, coupled to said second decoder means, for reading a first value stored in said first addressable cell in said sequence of said plurality of addressable cells, in response to a first control signal, and for writing a second value into said first addressable cell in said sequence of said plurality of addressable cells, in response to a second control signal.

14. The integrated circuit of claim 13 wherein said plurality of addressable cells comprises a variable length delay line having at least m*n stages arranged in m rows of n delay stages, with a tap provided at an output of each stage.

15. The integrated circuit of claim 14 wherein said first decoder means enables each of said n taps of the row of said delay line selected by said first portion of said grey code address.

16. The integrated circuit of claim 15 wherein said second decoder means enables a selected one of said n taps of said selected row of said delay line selected by said first portion of said grey code address.

* * * * *